United States Patent
Ishizaka et al.

(10) Patent No.: US 7,731,405 B2
(45) Date of Patent: Jun. 8, 2010

(54) SIDE-EMISSION TYPE LIGHT-EMITTING DIODE AND A BACKLIGHT UNIT USING THE LIGHT-EMITTING DIODE

(75) Inventors: Mitsunori Ishizaka, Minamitsuru-gun (JP); Teppei Takano, Fujiyoshida (JP); Junji Miyashita, Fujiyoshida (JP)

(73) Assignee: Citizen Electronics Co., Ltd., Yamanashi (JP)

( * ) Notice: Subject to any disclaimer, the term of this patent is extended or adjusted under 35 U.S.C. 154(b) by 166 days.

(21) Appl. No.: 12/121,482

(22) Filed: May 15, 2008

(65) Prior Publication Data
US 2008/0291691 A1 Nov. 27, 2008

(30) Foreign Application Priority Data
May 15, 2007 (JP) .............................. P2007-128778

(51) Int. Cl.
*F21V 7/04* (2006.01)
(52) U.S. Cl. ........................ 362/555; 362/800; 362/612; 313/512
(58) Field of Classification Search ................ 362/555, 362/800, 612, 613, 23, 26, 27; 313/498, 313/512
See application file for complete search history.

(56) References Cited

U.S. PATENT DOCUMENTS 7,314,296 B2 * 1/2008 Machi et al. ................. 362/470
2008/0217633 A1 * 9/2008 Chang et al. .................. 257/98

FOREIGN PATENT DOCUMENTS

JP 2005223082 8/2005

* cited by examiner

*Primary Examiner*—Sandra L O'Shea
*Assistant Examiner*—Evan Dzierzynski
(74) *Attorney, Agent, or Firm*—Browdy and Neimark, PLLC

(57) ABSTRACT

A side-emission type light-emitting diode including: a first substrate having a concavity formed in one of side surfaces of the first substrate, the concavity including an inner surface which is configured to be a first reflecting surface; an LED-element-mounting board of thin plate shape, arranged on the lower surface of the first substrate, the board configured to close the concavity at the lower surface of the first substrate; an LED element mounted on the board and arranged in the concavity; and a light-transmitting resin filled in the concavity and configured to seal the LED element.

12 Claims, 5 Drawing Sheets

SIDE-EMISSION TYPE LIGHT-EMITTING DIODE AND A BACKLIGHT UNIT USING THE LIGHT-EMITTING DIODE

CROSS-REFERENCE TO THE RELATED APPLICATION

This application is based on and claims the priority benefit of Japanese Patent Application No. 2007-128778, filed on May 15, 2007, the disclosure of which is incorporated herein by reference in its entirety.

BACKGROUND OF THE INVENTION

1. Field of the Invention

The present invention relates to a light-emitting diode (hereinafter, LED) of side-emission type, and a backlight unit using this LED.

2. Description of Related Art

Among generally known LEDs intended for a light source used in a backlight unit is a side-emission type LED in which an LED element is mounted on a substrate, a reflecting frame is disposed on the substrate and surrounds a peripheral edge surfaces of this LED element, and this frame has an opening which emit light from the LED element toward a peripheral edge surface of a light guiding plate (for example, see Japanese Patent Application Laid-Open No. 2005-223082, p. 3-4, FIG. 1).

FIG. 9 is a perspective view showing an LED for use as a conventional backlight source. In FIG. 9, the numeral 50 represents an LED of side-emission type. The numeral 52 represents a substrate, 53a and 53b represent a pair of electrodes formed on the substrate 52, 54 represents an LED element, 55 represents a light-transmitting resin, 56 represents a reflecting frame, and 59 represents a wiring pattern disposed on a motherboard on which the LED 50 is to be mounted.

The LED element 54 is mounted on an upper surface of the substrate 52, which is provided with the electrodes 53a and 53b and a die-bonding portion 53c extended from the electrode 53a. The LED element 54 is electrically connected to the substrate 52 and sealed by a light-transmitting resin 55. A frame 56 of U shape is disposed on the peripheral edge surface of the light-transmitting resin 55, and an inner surface 56a, 56b, and 56c of the frame 56 are configured to be reflecting surfaces by metal plating, for example. Surrounded by the frame 56, and sealed with the light-transmitting resin 55, the LED element is configured to emit light through a light emission surface 55a, which is an opening of the frame and exposes a portion of the peripheral edge surface of the light-transmitting resin 55.

An anode and a cathode electrodes of the LED element 54 are electrically connected to the electrodes 53a and 53b at disposed respective ends of the substrate 52 by die bonding and wire bonding. Both the electrodes 53a and 53b are in electrical connection with the wiring pattern 59 of the motherboard.

In other words, the conventional LED 50 has an LED structure in which the light emitted from the LED element 54, which is mounted on the substrate 52, is reflected by the inner surface 56a, 56b, and 56c of the frame, and emitted outside through the light emission surface 55a with high efficiency.

However, in the conventional LED 50, the LED element 54 is mounted on the substrate 52, and the bonding wire is further extended from the upper surface of the LED element 54. The LED 50 therefore has a predetermined thickness, which gives rise to the following problems.

FIG. 10 is a partially sectional view showing the physical relationship between the conventional LED 50 and a light guiding plate 60. The thickness of the substrate 52 and the total thickness of the LED 50 will be designated by the numerals 61 and 64, respectively. A peripheral edge surface of the light guiding plate 60 facing the light emission surface 55a receives light emitted from the LED element 54.

Since the LED element 54 is mounted on the substrate 52, the center of the emitted light 65 from the LED element 54 is raised by an amount which accords with the thickness of the substrate 52. There has thus been a problem that a thickness of the light guiding plate 60 has to be large in accordance with a thickness of the substrate.

Since the center of the irradiation light 65 is raised by an amount which accords with the thickness of the substrate 52, there has been another problem that the amount of irradiation light drops in the lower part of the light guiding plate 60.

SUMMARY OF THE INVENTION

It is thus an object of the present invention to provide an LED which emits light sideways with high efficiency, and a backlight unit which uses this LED as its light source and emits light toward a peripheral edge surface of a light guiding plate.

To achieve the foregoing object, an LED according to an embodiment of the present invention includes: a first substrate having an upper surface, a lower surface, and a peripheral edge surface between the upper and lower surfaces, a concavity disposed in the peripheral edge surface of the first substrate, the concavity passing through the upper and lower surfaces in top plan view, the concavity including an inner surface which is configured to be a first reflecting surface; an LED-element-mounting board of thin plate shape, arranged on the lower surface of the first substrate, and configured to close the concavity at the lower surface of the first substrate in top plan view; an LED element mounted on the upper surface of the LED-element-mounting board, and the LED element configured to be in the concavity; and a light-transmitting resin filled in the recess and sealing the LED element.

Moreover, an LED according to another embodiment of the present invention includes: a first substrate having a concavity formed in a peripheral edge surface thereof, the concavity including an inner surface which is configured to be a first reflecting surface; a second substrate arranged on an upper surface of the first substrate, having an upper surface, a lower surface, and a peripheral edge surface between the upper and lower surfaces, a concavity disposed in the peripheral edge surface of the second substrate, the concavity passing through the upper and lower surfaces of the second substrate in plan view, the concavity including an inner surface which configured to be a second reflecting surface; an LED-element-mounting board of thin plate shape, arranged on the lower surface of the first substrate, and the board configured to close the concavity at the lower surface of the first substrate; an LED element mounted on an upper surface of the board and arranged in the concavity of the first substrate; and a light-transmitting resin filled in the concavities of the respective first and second substrates and sealing the LED element. The concavities of the first substrate and the second substrate are configured to overlap with each other at least in part in top plan view.

Furthermore, in a backlight unit using the LED according to one embodiment of the present invention, a peripheral edge surface of a light guiding plate faces the light-emitting surface of the LED.

DETAILED DESCRIPTION OF THE PREFERRED EMBODIMENTS

Hereinafter, preferred embodiments of the present invention will be described in detail with reference to the accompanying drawings.

Figure 1:
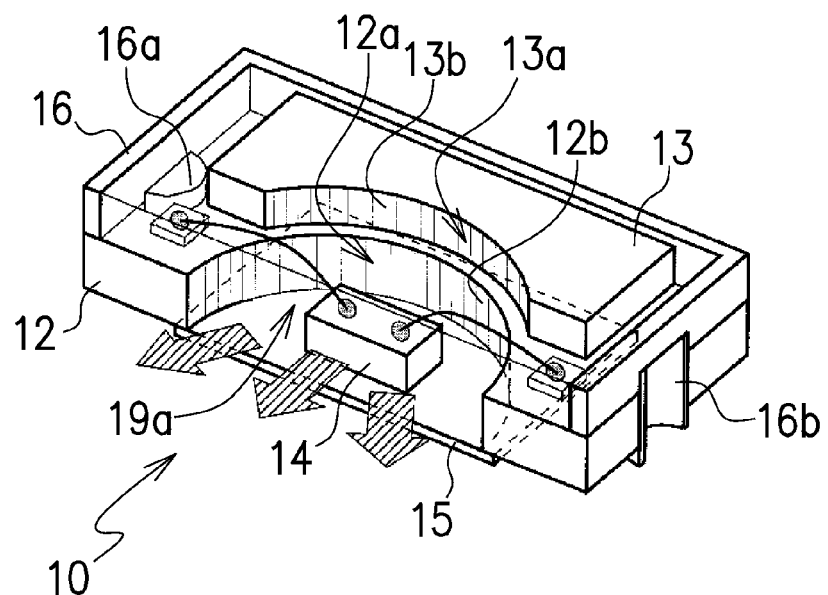
FIG. 1 is a perspective view of an LED according to a first embodiment of the present invention.
Figure 2:
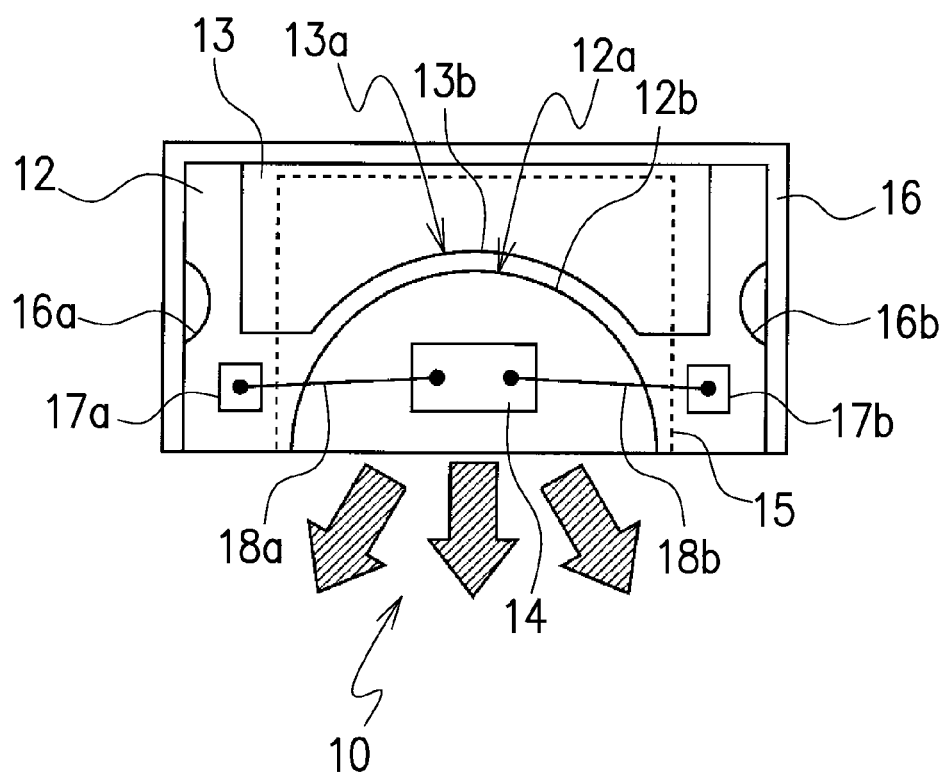
FIG. 2 is a top plan view of the LED according to the first embodiment.
Figure 3:
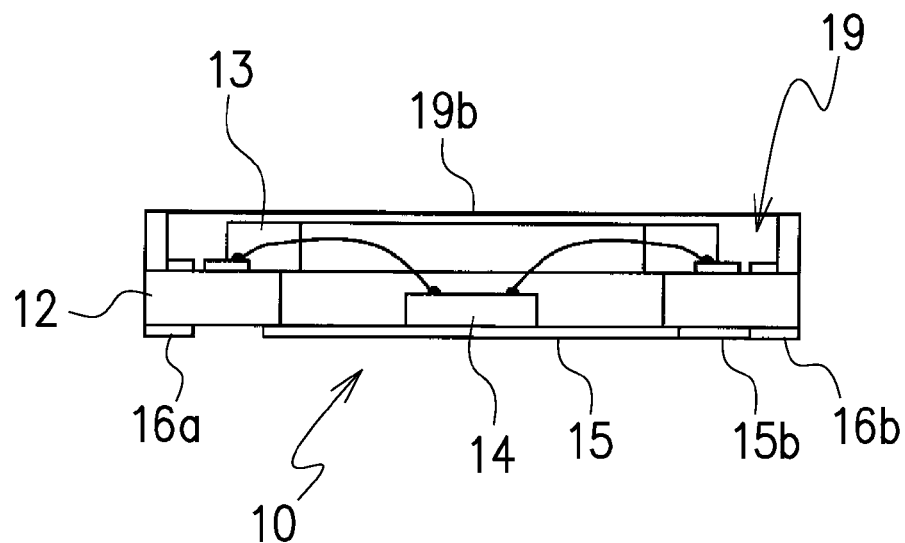
FIG. 3 is a front plan view of the LED according to the first embodiment.

FIGS. 1 to 3 show a first embodiment of the LED according to the present invention. The most characteristic structure of the LED according to the present embodiment is a first substrate which has an upper surface, a lower surface, and a peripheral edge surface between the upper and lower surfaces. This first substrate has a concavity disposed in the peripheral edge surface, the concavity passing through the upper and lower surfaces of the first substrate. An LED-element-mounting board on which an LED element is mounted can be thinner than the first substrate. In another embodiment explained below, the board is configured to be an electrode which is as thin as another electrode disposed on a first substrate. The board is disposed to close the concavity at the lower surface of the first substrate. The LED element mounted on the board is configured to be disposed in the concavity.

In FIGS. 1 to 3, the numeral 10 represents a side emission-type LED. The numeral 12 represents the first substrate. A concavity 12a of semicircular shape is formed in the center area at a peripheral edge surface of the substrate, including an inner surface which is configured to be a first reflecting surface 12b. The numeral 13 represents a second substrate which is disposed on the upper surface of the first substrate 12. The second substrate also has an upper surface, a lower surface, and a peripheral edge surface between the upper and lower surfaces. A concavity 13a of semicircular shape in top plan view, passing through the upper and lower surfaces of the second substrate, is configured to overlap the concavity of the first substrate at least one part, and the inner surface of the concavity 13a is configured to be a second reflecting surface 13b.

The numeral 14 represents an LED element, which is mounted on the upper surface of an LED-element-mounting board 15 which is made of a thin flat plate and arranged on the lower surface of the first substrate 12. The numeral 16 represents a frame, which is disposed on a periphery of the upper surface of the first substrate and surrounds the second substrate 13 except a portion of the peripheral edge surface of the second substrate where the concavity 13a is provided.

The numerals 16a and 16b represent first and second through-holes formed in the peripheral edge surface of the first substrate 12 at opposite sides, respectively. The numerals 17a and 17b represent first and second electrodes formed on the upper surface of the first substrate 12, respectively. The numerals 18a and 18b represent bonding wires for connecting the first and second electrodes 17a and 17b with an anode and a cathode disposed on the upper surface of the LED element 14, respectively. Moreover, the numeral 19 represents a light-transmitting resin which is filled in the interior of the frame 16, sealing the LED element 14. A portion of the peripheral edge surface of the first substrate and a portion of the peripheral edge surface of the first substrate 12 constitute a flat surface at a side where a light emission surface 19a is defined. The light emission surface 19a is exposed from the frame 16.

The board 15 may be either a thin metal plate or insulating plate. In the case that the LED board 15 is made of a metal plate, this metal plate may constitute part of a bottom electrode of the first substrate 12 and may be electrode-like thin. When constituting a part of an electrode disposed on the lower surface of the first substrate 12, the board 15 is electrically connected to the first through-hole 16a or the second through-hole 16b. FIG. 3 shows the case where the LED-element-mounting board 15 and the second through hole 16b are in electrical connection via a wiring pattern 15b.

The LED element 14 is surrounded by the first reflecting surface 12b which is an inner surface of the concavity 12a in the peripheral edge surface of the first substrate 12, and the second reflecting surface 13b which is an inner surface of the concavity 13a in the peripheral edge of the second substrate 13. The inner surface of the concavity 12a of the first substrate 12 and the inner surface of the concavity 13a of the second substrate 13 are formed substantially concentrically and overlaps at least in part in top plan view. The LED element 14 mounted on the upper surface of the board 15 is configured to be in a substantially central portion of the concavity 12a in top plan view. The space bordered by the concavity 12a of the first substrate 12, the concavity 13a of the second substrate 13, and the inside of the frame 16 is then filled with the light-transmitting resin 19 as shown in FIG. 1. Incidentally, the frame 16 may be formed integrally with the second substrate.

Note that the first and second electrodes 17a and 17b are electrically connected to the first and second through-holes 16a and 16b, respectively, through a circuit pattern (not shown) formed on the upper surface of the first substrate 12.

Consequently, as shown in FIGS. 1 and 2, even if the light emitted from the LED element 14, which is arranged near the center of the concavities 12a and 13a of the respective first and second substrates 12 and 13, travels backward in part, it is reflected by the first and second reflecting surfaces 12b and 13b toward the peripheral edge surface of the light-transmitting resin 19 through the light emission surface 19a of the light-transmitting resin 19 with high efficiency.

It should be noted that the light-transmitting resin 19 mentioned above is made of an optically-transparent resin if the light emitted from the LED element 14 is used in its original color, and is made of an optically-transparent resin that contains fluorescent particles if blue, white, or other light of short wavelengths is intended. As shown in FIG. 3, the upper surface 19b of the light-transmitting resin 19 is a flat surface, which may be sealed with a molding material, plating, or the like with substantially a same thickness as that of the LED-element-mounting board 15. This can suppress emission in unnecessary directions other than to the direction where the light emitted from the LED element 14 is required, thereby bringing the light incident on a light guiding plate to be described later into proper balance.

Figure 4:
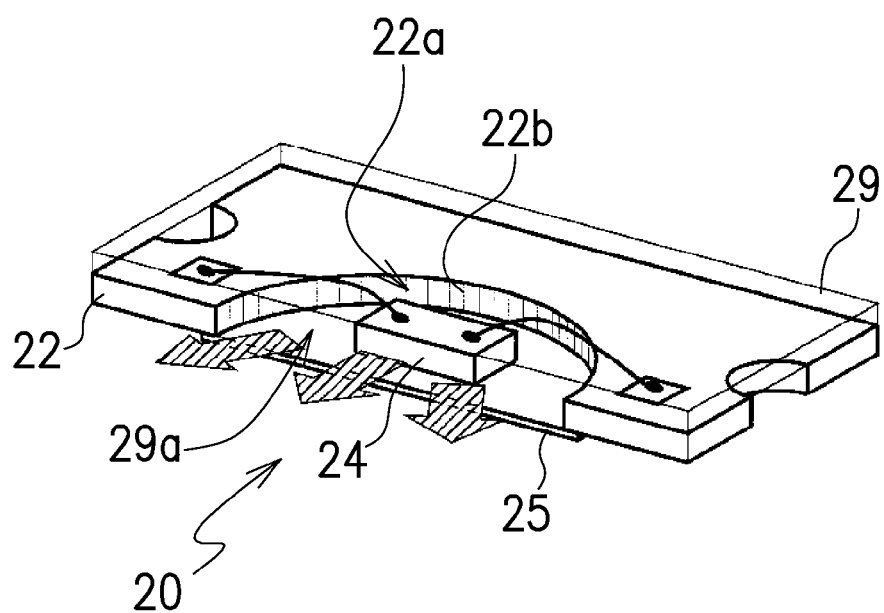
FIG. 4 is a perspective view of an LED according to a second embodiment of the present invention.

FIG. 4 shows a perspective view of a side-emission type LED according to a second embodiment.

In FIG. 4, the numeral 20 represents the side-emission type LED, which has substantially similar configuration to the first embodiment except a second substrate provided in the LED 10. More specifically, the numeral 22 represents a first substrate. The numeral 22a represents a concavity of semicircular shape which is formed in a peripheral edge surface of the first substrate 22, the concavity passes through an upper surface and an lower surface of the first substrate, and the concavity includes an inner surface which configured to be a first reflecting surface 22b. The numeral 24 represents an LED element, which is mounted on an LED-element-mounting board 25 of thin plate shape arranged on the lower surface of the first substrate 22. A light-transmitting resin 29 that seals the LED element disposed on the board 25 and fills the interior of the concavity 22a of the first substrate 22 and the upper surface of the first substrate 22. The light-transmitting resin 29 also has a light emission surface 29a at a portion of the peripheral edge surface of the light-transmitting resin 29, and the emission surface 29a is opposite to the first reflecting surface 22b.

Like the LED 10 according to the foregoing first embodiment, the above-mentioned LED 20 emits light forward from the light emission surface 29a of the light-transmitting resin 29 efficiently. It also has the advantage that the absence of the second substrate allows a smaller total thickness than in the first embodiment.

Figure 5:
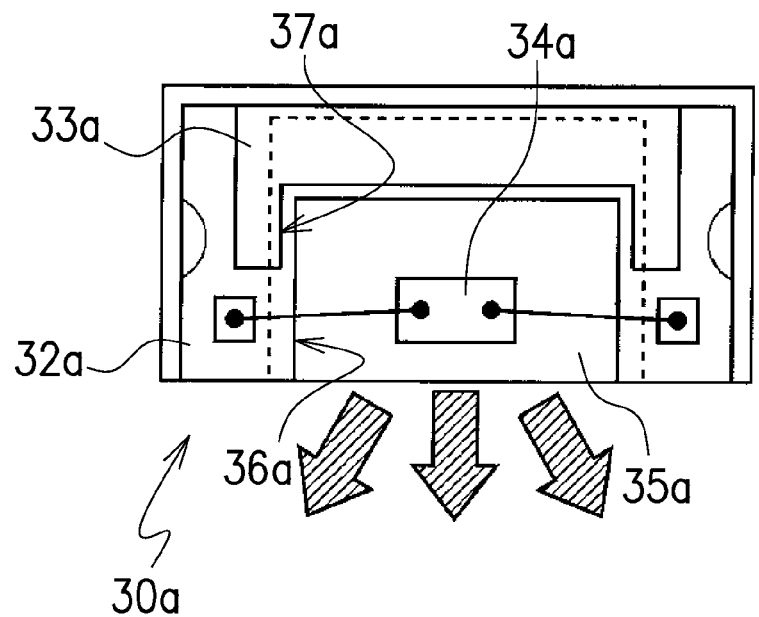
FIG. 5 is a top plan view of an LED according to a third embodiment of the present invention.
Figure 6:
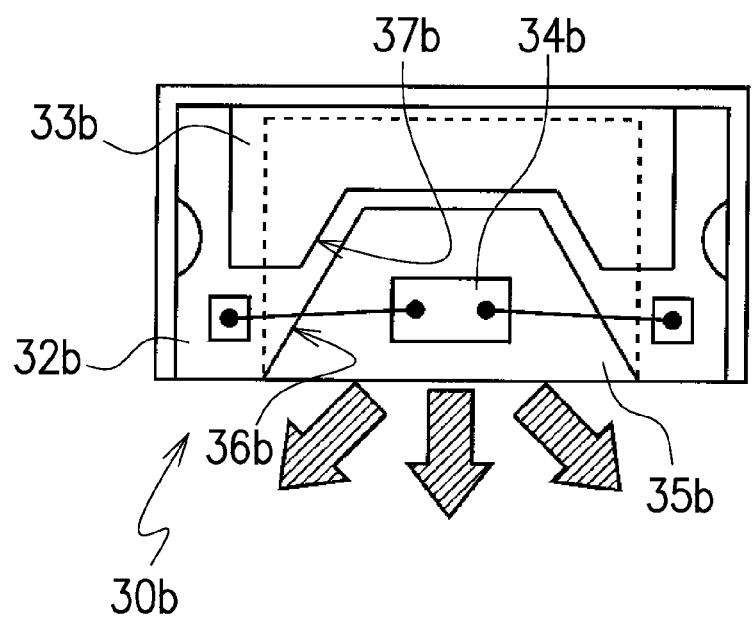
FIG. 6 is a top plan view of an LED according to a fourth embodiment of the present invention.
Figure 7:
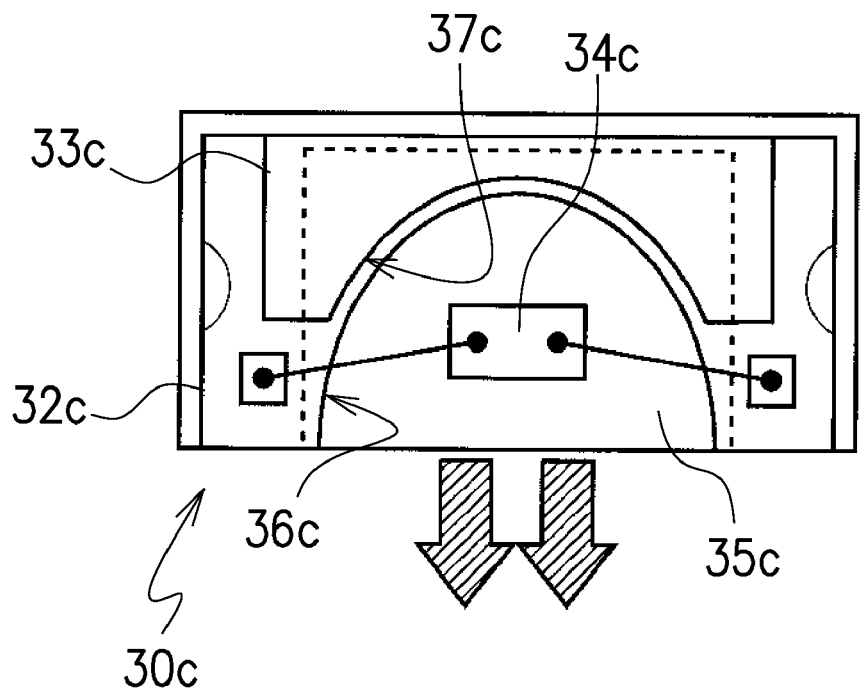
FIG. 7 is a top plan view of an LED according to a fifth embodiment of the present invention.

FIGS. 5, 6, and 7 show LEDs according to a third, a fourth, and a fifth embodiments, respectively.

FIG. 5 shows an LED 30a according to the third embodiment. Like the foregoing first embodiment, this LED 30a has a first substrate 32a and a second substrate 33a, and an LED element 34a is mounted on the upper surface of an LED-element-mounting board 35a which is arranged on the bottom of the first substrate 32a.

The third embodiment discloses that the concavities 36a and 37a formed in the first substrate 32a and the second substrate 33a, respectively, are rectangular in shape, and that the LED element 34a is arranged near the center of these rectangular concavities 36a and 37a when seen in top plan view. The simpler shape of the concavities 36a and 37a produces the effect that reflecting surfaces can be formed on the inner surfaces of the concavities more easily.

FIG. 6 shows an LED 30b according to the fourth embodiment. Like the foregoing first embodiment, this LED 30b also has a first substrate 32b and a second substrate 33b, and is configured so that an LED element 34b is mounted on the top of an LED-element-mounting board 35b which is arranged on the bottom of the first substrate 32b.

The fourth embodiment is characterized in that the concavities 36b and 37b formed in the first substrate 32b and the second substrate 33b, respectively, are polygonal in shape, and that the LED element 34b is arranged near the center of these polygonal concavities 36b and 37b. In this embodiment, the concavities 36b and 37b are shaped like a trapezoid, or a part of a hexagon. The polygonal concavities 36b and 37b form reflecting surfaces, and produce emission light similar to that of the semicircular concavities in the first embodiment.

FIG. 7 shows an LED 30c according to the fifth embodiment. Like the foregoing first embodiment, this LED 30c also has a first substrate 32c and a second substrate 33c, and is configured so that an LED element 34c is mounted on the top of an LED-element-mounting board 35c which is arranged on the bottom of the first substrate 32c.

The fifth embodiment is characterized in that the concavities 36c and 37c formed in the first substrate 32c and the second substrate 33c, respectively, are semielliptic in shape in top plan view, and that the LED element 34c is arranged near the center of these semielliptic shapes. The semielliptic shapes in this embodiment are similar to parabolic shapes, and thus improve the convergence of the emitted light.

That concludes description of the third, fourth, and fifth embodiments of the present invention, but it should be noted that they may be configured with the first substrate alone, without using the second substrate as in the foregoing second embodiment. In such cases, the total thicknesses of the LEDs can be reduced significantly as with the LED 20 of the second embodiment.

Next, the superiority of the present invention in terms of LED thickness will be described by comparison with the conventional LED 50 which has been described above in FIG. 10.

Figure 8:
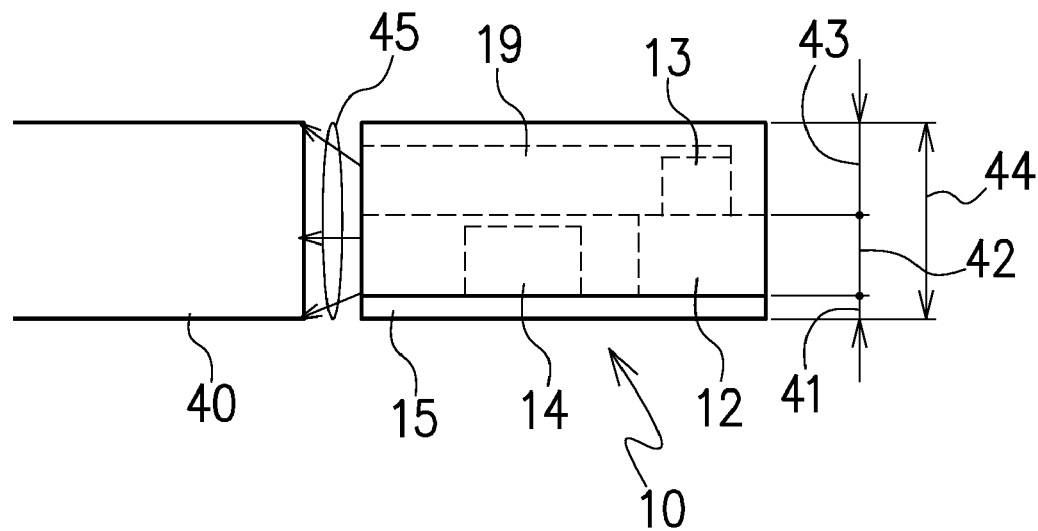
FIG. 8 is a partially sectional view showing the physical relationship between an LED according to the present invention and a light guiding plate.
Figure 9:
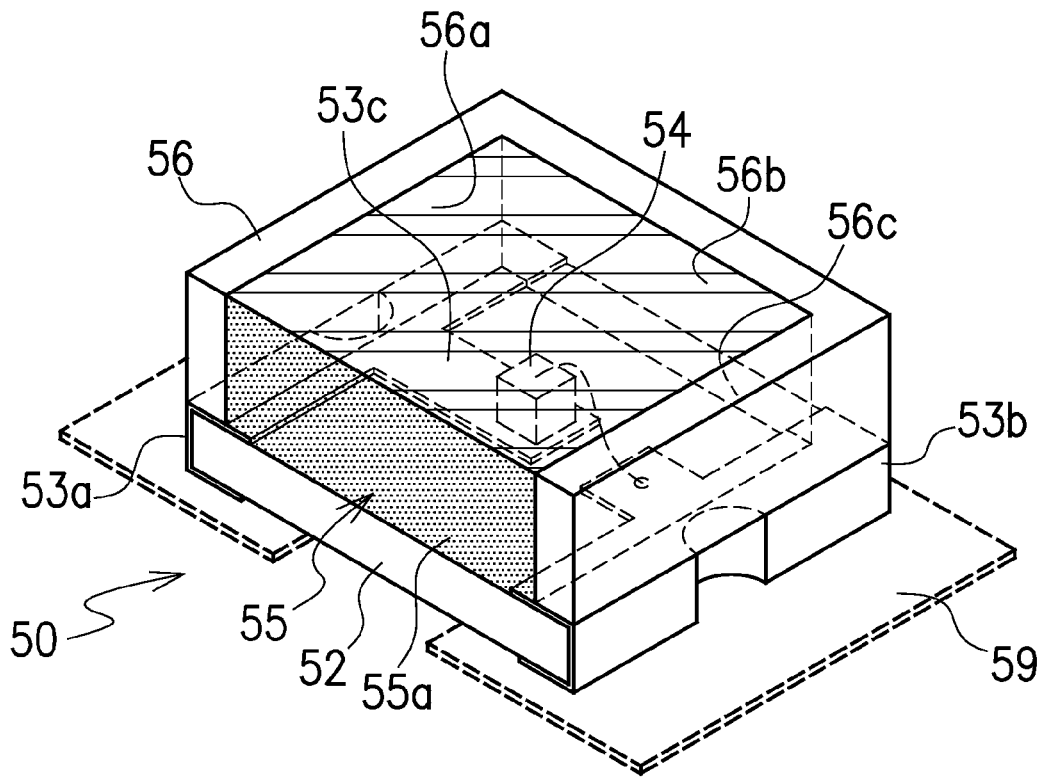
FIG. 9 is a perspective view of a conventional LED.

FIG. 8 is a partially sectional view of a backlight unit, which comprises the side-emission type LED 10 according to the first embodiment and a light guiding plate 40, showing the physical relationship in which the light emission surface of the LED 10 faces a peripheral edge surface of the light guiding plate 40. In this diagram, the LED 10 is composed of the first substrate 12, the second substrate 13 arranged on the upper surface of the first substrate 12, the LED-element-mounting board 15 arranged on the lower surface of the first substrate 12, and the LED element 14 mounted on the upper surface of the same.

Since the LED-element-mounting board 15 is made of an extremely thin metal plate, which is decreased to be electrode-like thin in thickness, it is possible to lower the light-emitting position of the LED element 14. In addition, the anode and the cathode of the LED element 14 are electrically connected to the first and second electrodes 17a and 17b on the upper of the first substrate 1 as mentioned previously. This makes it possible to lower positions where the bonding wires are bonded, and thus, to lower the height of the bonding wires.

That is, the total thickness 44 of the LED 10 according to the present invention is the sum of: the thickness 41 of the LED-element-mounting board 15 which can be electrode-like thin; the thickness 42 of the first substrate 12; and a thickness 43 which is the thickness of the second substrate 13 plus the barest thickness of the light-transmitting resin 19 on the upper surface of the LED 10.

Figure 10:
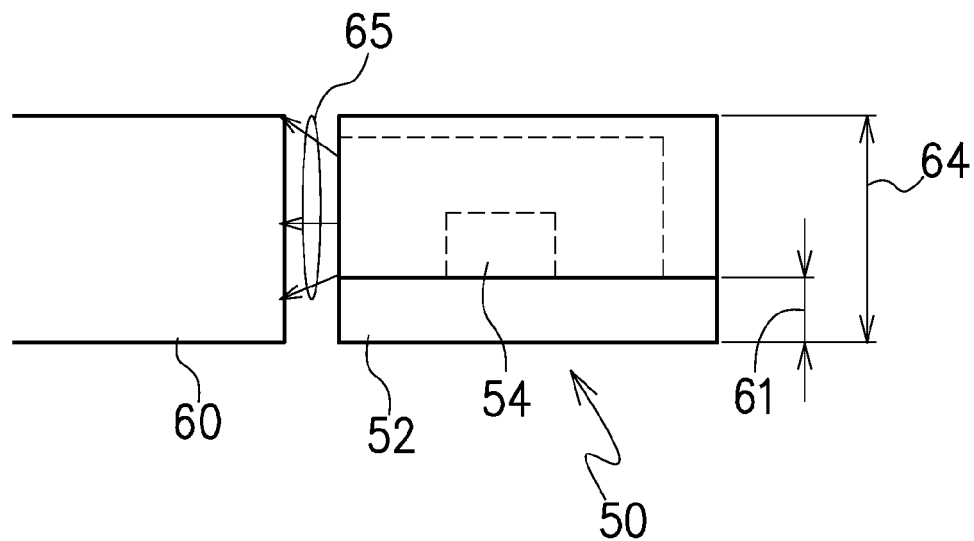
FIG. 10 is a partially sectional view showing the positional relationship between the conventional LED and a light guiding plate.

Incidentally, while the conventional LED substrate 52 described in FIG. 10 has a thickness of approximately 0.1 mm, the LED-element-mounting board 15 of the LED 10 according to the present invention has a thickness of approximately 0.05 mm, which can be reduced even further. This makes it possible, in one example, to lower the light-emitting position of the LED element 14 by 0.05 mm or more as compared to the conventional LED. The total thickness can also be decreased, since the bonding wires extended from the upper surface of the LED element 14 is disposed below the upper surface of the second substrate 13. As a result, the light guiding plate 40 can also be thinned to the thickness of the LED 10, and the center of the irradiation light 45 is lowered by an amount in accordance with the lowering of the light-emitting position of the LED element 14. This provides the advantage that the amount of irradiation light increases in the lower part of the light guiding plate 40.

As has been described, the side emission-type LED has the LED element mounted on the LED-element-mounting board of small thickness. The first substrate lying below and the second substrate arranged on the upper surface of this first substrate are both provided with a concavity having a reflecting area. The LED element is arranged substantially in the center of these concavities, and the bonding wires extended from this LED element are arranged on the upper surface of the first substrate. This makes it possible to provide a low-profile backlight unit, which comprises an LED of high irradiation efficiency in which the LED-element-mounting board and the bonding wires are suppressed in height, and in which reflecting areas of sufficient size are secured.

A low-profile display of high emission efficiency can also be provided, comprising: the side-emission type LED according to the present invention; a light guiding plate having an upper surface, a lower surface, and a peripheral edge surface between the upper and the lower surfaces, with the light emission surface of the LED disposed to face the peripheral edge surface; and a display panel, for example, a liquid crystal panel facing at least either one of the upper surface and the lower surface of the light guiding plate.

While preferred embodiments of the present invention have been described, it will be understood that the present invention is not limited to these embodiments, and various changes and modifications may be made to the embodiments.

What is claimed is:

1. A side-emission type light-emitting diode comprising: a first substrate having an upper surface, a lower surface, and a peripheral edge surface between the upper and the lower surfaces, a concavity disposed in one of the peripheral edge surface, the concavity passing through the upper surface and the lower surface of the first substrate in top plan view, the concavity including an inner surface configured to be a first reflecting surface; a light-emitting-diode-element-mounting board of thin plate shape, arranged on the lower surface of the first substrate, the board configured to close the concavity at the lower surface of the substrate; a light-emitting diode element mounted on an upper surface of the light-emitting-diode-element-mounting board, disposed in the concavity, and electrically connected to the first substrate; and a light-transmitting resin sealing the light-emitting diode element and having an upper surface, a lower surface and a peripheral edge surface between the upper and the lower surfaces; further comprising a second substrate arranged on the upper surface of the first substrate, the second substrate having an upper surface, a lower surface, and a peripheral edge surface between the upper and the lower surfaces, a concavity disposed in the peripheral edge surface, the concavity passing through the upper surface and the lower surface of the second substrate in top plan view, the concavity including an inner surface configured to be a second reflecting surface, and wherein the concavities of the first substrate and the second substrate overlap with each other at least in part in top plan view.

2. The side-emission type light-emitting diode according to claim 1, wherein the concavities of the respective first and second substrates are substantially semicircular in shape in top plan view.

3. The side-emission type light-emitting diode according to claim 1, wherein the concavities of the respective first and second substrates are rectangular in shape in top plan view.

4. The side-emission type light-emitting diode according to claim 1, wherein the concavities of the respective first and second substrates are polygonal in shape in top plan view.

5. The side-emission type light-emitting diode according to claim 1, wherein the concavities of the respective first and the second substrates are semi-elliptic in shape in top plan view.

6. The side-emission type light-emitting diode according to claim 1, wherein an anode and a cathode electrodes of the light-emitting diode element are electrically connected with bonding wires to a first electrode and a second electrode disposed on the upper surface of the first substrate.

7. The side-emission type light-emitting diode according to claim 1, wherein the board disposed on the lower surface of the first substrate is a thin metal plate, and constitutes a part of a lower electrode disposed on the lower surface of the first substrate.

8. The side-emission type light-emitting diode according to claim 7, wherein the part of the lower electrode is electrically connected to one of the first electrode and the second electrode disposed on the upper surface of the first substrate.

9. The side-emission type light-emitting diode according to claim 1, wherein the light-transmitting resin contains fluorescent particles.

10. The side-emission type light-emitting diode according to claim 1, wherein the upper surface of the light-transmitting resin is covered with a molding material or plating.

11. A backlight unit comprising: the side-emission type light-emitting diode according to claim 1, having a light emission surface on at least one side of the light-transmitting resin filled in the concavity; and a light guiding plate having a peripheral edge surface facing the light emission surface of the light-emitting diode.

12. A side-emission type light-emitting diode comprising: a first substrate having an upper surface, a lower surface, and a peripheral edge surface between the upper surface and the lower surface, a concavity disposed in the peripheral edge surface, the concavity passing through the upper surface and the lower surface of the first substrate in top plan view, the concavity including an inner surface configured to be a first reflecting surface; a second substrate arranged on an upper surface of the first substrate, the second substrate having an upper surface, a lower surface, and a peripheral edge surface between the upper surface and the lower surface, a concavity disposed in the peripheral edge surface, the concavity passing through the upper and lower surfaces of the second substrate and including an inner surface configured to be a second reflecting surface; a light-emitting-diode-element-mounting board of thin plate shape, arranged on the lower surface of the first substrate, the board configured to close the concavity at the lower surface of the first substrate; a light-emitting diode element mounted on an upper surface of the board and disposed in the concavity of the first substrate; and a light-transmitting resin sealing the light-emitting diode element and filled in the concavities of the respective first and second substrates; the concavities of the first substrate and the second substrate overlapping with each other at least in part in top plan view.

* * * * *

UNITED STATES PATENT AND TRADEMARK OFFICE
CERTIFICATE OF CORRECTION

| | | |
|---|---|---|
| PATENT NO. | : 7,731,405 B2 | Page 1 of 1 |
| APPLICATION NO. | : 12/121482 | |
| DATED | : June 8, 2010 | |
| INVENTOR(S) | : Mitsunori Ishizaka et al. | |

It is certified that error appears in the above-identified patent and that said Letters Patent is hereby corrected as shown below:

On the Title Page and Col. 1 line 1

In the title, please insert the article -- A -- at the beginning of the title.

-- A SIDE-EMISSION TYPE LIGHT-EMITTING DIODE AND A BACKLIGHT UNIT USING THE LIGHT-EMITTING DIODE --

Signed and Sealed this
Thirteenth Day of September, 2011

David J. Kappos
*Director of the United States Patent and Trademark Office*